(12) United States Patent
Zhu et al.

(10) Patent No.: US 7,433,426 B2
(45) Date of Patent: Oct. 7, 2008

(54) ADAPTIVE HYSTERESIS RECEIVER FOR A HIGH SPEED DIGITAL SIGNAL

(75) Inventors: Zhubiao Zhu, Fort Collins, CO (US); Kenneth Koch, II, Fort Collins, CO (US); David J. C. Johnson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 754 days.

(21) Appl. No.: 10/831,095

(22) Filed: Apr. 23, 2004

(65) Prior Publication Data

US 2005/0238119 A1     Oct. 27, 2005

(51) Int. Cl.
*H03K 9/00* (2006.01)
*H04L 27/00* (2006.01)

(52) U.S. Cl. .................. 375/316; 327/73; 327/205; 327/563; 375/219

(58) Field of Classification Search ............... 375/316, 375/219; 327/205, 73, 563
See application file for complete search history.

(56) References Cited

U.S. PATENT DOCUMENTS

| 5,341,033 | A | | 8/1994 | Koker | |
|---|---|---|---|---|---|
| 5,654,645 | A | * | 8/1997 | Lotfi | ............... 326/24 |
| 6,211,712 | B1 | * | 4/2001 | Baik | ............... 327/206 |
| 6,496,886 | B1 | * | 12/2002 | Osaka et al. | ............ 710/100 |
| 6,778,111 | B1 | | 8/2004 | Zhu et al. | |

* cited by examiner

*Primary Examiner*—Ted Wang (57) ABSTRACT

An adaptive hysteresis receiver processes a high speed digital signal. A differential receiver circuit compares the high speed digital signal to a reference voltage to generate an output signal. A register circuit latches the output signal, according to a clock signal, to produce a control signal. A reference voltage generator generates the reference voltage, from a plurality of voltages defining a deep hysteresis level and a shallow hysteresis level, in response to the output signal and the control signal.

20 Claims, 10 Drawing Sheets

ADAPTIVE HYSTERESIS RECEIVER FOR A HIGH SPEED DIGITAL SIGNAL

BACKGROUND

With increasing processing speed of digital signals in modern circuits, the effect of noise on these signals becomes increasingly problematic. These noise problems are further exacerbated when a number of digital circuits connect to a single bus and receive the same signal.

Many techniques have been employed to reduce noise sensitivity of such circuits. In signals where the information content is coincident with the edge of the waveform (e.g., where the edge of a strobe signal is used to latch data and/or clock state machines), a "glitch" can nonetheless cause a significant problem. A glitch is a short pulse or noise spike to which circuit response is not desired. A two-dimensional de-glitch filter may, for example, be used for these types of signals, such as described in U.S. patent application Ser. No. 10/653,341, filed on Sep. 2, 2003, now U.S. Pat. No. 6,778,111, issued Aug. 17, 2004, and incorporated herein by reference.

In signals where information content is determined by signal level and a data clock, a receiver circuit may use a differential receiver to compare an input signal to a threshold level to determine if the input signal is high or low. The receiver circuit utilizes two threshold levels, a high voltage threshold and a low voltage threshold, respectively representing high and low switching levels. When the input signal rises above the high voltage threshold, the differential receiver changes state of the receiver circuit; when the input signal drops below the low voltage threshold, the differential receiver again changes the state of the receiver circuit.

The voltage difference between the low voltage threshold and the high voltage threshold is known as input hysteresis. The receiver circuit is thus often called a hysteresis receiver. The hysteresis receiver resists noise when the noise is lower in magnitude than the amount of input hysteresis, which must be less than the minimum difference between the low and high levels of the input signal to ensure correct operation.

Typically, in a bus system with multiple receiver circuits (e.g., multiple chips connected to a bus), the minimum difference between the low and high levels of the input signal, when data is valid, is reduced, thereby reducing the amount of usable input hysteresis. Often, therefore, the noise level increases above the hysteresis level; noise then transfers through the hysteresis receiver circuits. The use of 'deep' hysteresis levels, where the amount of input hysteresis is large, also reduces the response time of the hysteresis receiver circuit since the input signal takes longer to reach the transition threshold levels. Where the deep hysteresis levels are close to the maximum input signal levels, any reduction in input signal level (e.g., caused by temperature or bus loading variations) may cause the hysteresis receiver circuit to fail in the detection of valid transitions in the input signal. In such circumstances, information may be lost.

Another technique for reducing sensitivity to noise in digital signals is to design the receiver circuit to respond only to input pulses that exceed a predetermined minimum pulse width, thereby ignoring pulses of lesser duration. This technique is utilized within a "timing-based" receiver circuit. Typically, the timing-based receiver circuit has a timer that starts when a first transition in the input signal is detected. If a second transition occurs before the timer expires, both the first and second transitions are ignored, removing the noise. If the timer expires before the second transition occurs, the timing-based receiver circuit outputs the transition, thereby passing signal pulses to a receiving circuit. Any transition must be present at the input longer than the periodicity of the timer in order for the transition to be passed to the output of the timing-based receiver circuit.

For correct operation, the predetermined minimum pulse width in a timing-based circuit must be greater than the width of any encountered noise and also less than the pulse width of any valid signal. This timing-based receiver circuit technique is typically used in non-timing critical circuits where, for example, a slow copy of a strobe signal may be used to clock a non-timing critical state machine. A similar timing-based receiver technique reduces sensitivity of digital signals to noise by passing a first edge of the digital signal and suppressing subsequent edges for a time period set by a delay line duration. However, as the data rate of the input signal increases, the noise duration often matches or exceeds the duration of the delay in the timing-based receiver, in which case the noise is not removed.

Hysteresis and timing-based techniques may be combined in a receiver circuit. When combined, the hysteresis and timing-based receiver circuit may operate to remove certain types of noise. For example, U.S. Pat. No. 5,341,033 (the '033 patent) describes one circuit that removes noise using a hysteresis buffer with two levels of hysteresis and a timer. When the hysteresis buffer detects a transition, the timer is triggered. The timer is in feedback with the hysteresis buffer to increase the buffer's hysteresis, thereby ignoring noise until the timer expires. The circuit of the '033 patent is a first-edge pass (timing-based) noise protection circuit with hysteresis and is more suited to input signals with short duration noise (i.e., noise close to the active edge of the input signal). The '033 patent is incorporated herein by reference.

As bus speeds increase, signal periodicity decreases and noise duration becomes longer, relative to the signal period, making timing-based receivers less suitable for removing noise from the high speed bus signals. Further, Very Large Scale Integration (VLSI) implementation of a delay line incurs large variations in the operational delay period due to manufacturing tolerances and operating temperature variation. The operational delay period typically varies by a factor of two or more, causing the timing-based receiver to have unpredictable operation.

SUMMARY OF THE INVENTION

In one embodiment, an adaptive hysteresis receiver is provided for a high speed digital signal. A differential receiver circuit compares the high speed digital signal to a reference voltage, to generate an output signal. A register circuit latches the output signal, according to a clock signal, to produce a control signal. A reference voltage generator generates a reference voltage, from a plurality of voltages defining a deep hysteresis level and a shallow hysteresis level, in response to the output signal and the control signal.

In another embodiment, an adaptive hysteresis receiver is provided for a high speed digital signal. A differential receiver circuit compares the high speed digital signal to a reference voltage, to generate an output signal. A register circuit latches the output signal, according to a clock signal, to produce a control signal. A reference voltage generator generates a reference voltage, from a plurality of voltages defining (a) no hysteresis, (b) one or more hysteresis levels, and (c) adaptive hysteresis, in response to one or more configuration inputs.

In another embodiment, a method reduces noise received with a high speed digital signal. The high speed digital signal is compared to a reference voltage to generate an output signal. The output signal is latched, according to a clock signal, to produce a control signal. A reference voltage is generated, from a plurality of voltages defining a deep hysteresis level and a shallow hysteresis level, in response to the output signal and the control signal.

In another embodiment, a method reduces noise received with a high speed digital signal. A shallow hysteresis level is selected based upon a previous output signal value and a clock signal. The high speed digital signal is compared to the shallow hysteresis level to produce a current output signal. A deep hysteresis level is selected if a transition occurs in the current output signal. The current output signal is latched by the clock signal to produce the previous output signal.

DETAILED DESCRIPTION OF THE FIGURES

Figure 1:
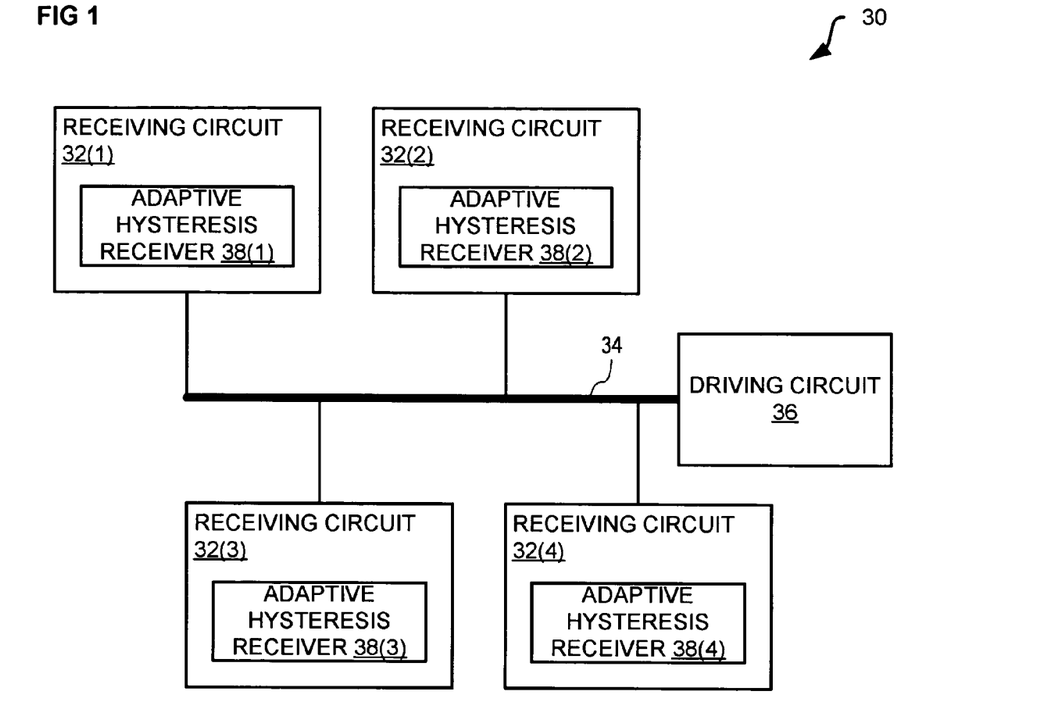
FIG. 1 shows one system embodiment with four adaptive hysteresis receivers connected to a single bus driven by a driving circuit.

FIG. 1 illustrates an exemplary embodiment of one system 30 that has four receiving circuits 32 connected to a single bus 34 driven by a driving circuit 36. Each receiving circuit 32 has at least one adaptive hysteresis receiver 38, such as shown. More or fewer receiving circuits 32 and adaptive hysteresis receivers 38 may exist depending upon the desired application.

In operation, driving circuit 36 generates high speed digital signals on bus 34. These high speed digital signals may have varying amounts of noise (e.g., unwanted signals) at different positions on bus 34. Each adaptive hysteresis receiver 38 receives one of the high speed digital signals of bus 34, and operates to ignore noise for that one signal. Accordingly, although not shown, each receiving circuit 32 may have a plurality of adaptive hysteresis receivers 38 so that receiving circuit 32 can receive multiple noise-free signals from bus 34.

Bus 34 may represent a high speed digital connection. For example, bus 34 may represent copper tracks on a printed circuit board that connect a high speed processor to a memory device.

Figure 2:
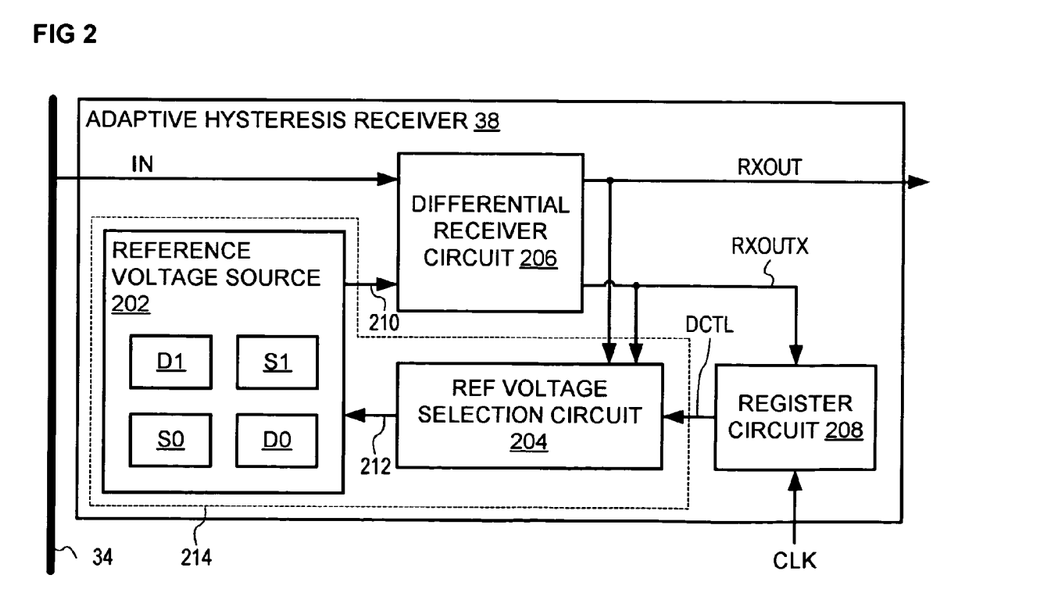
FIG. 2 is a block diagram illustrating one exemplary embodiment of an adaptive hysteresis receiver for a high speed digital signal.

FIG. 2 is a block diagram illustrating one exemplary embodiment of adaptive hysteresis receiver 38, FIG. 1, used to process a high speed digital signal of bus 34. A reference voltage generator 214 is illustratively shown with a reference voltage source 202 and a reference voltage selection circuit 204. Reference voltage source 202 generates four reference voltages D1, S1, S0 and D0. Reference voltage selection circuit 204 selects one reference voltage D1, S1, S0 or D0, via a voltage selection signal 212, for output as a reference voltage signal 210. Reference voltage signal 210 inputs to a differential receiver circuit 206 for comparison to an input signal IN, for example as received from bus 34. Differential receiver circuit 206 produces signals RXOUT and its inverse, RXOUTX, based upon the comparison of reference voltage signal 210 and input signal IN. Signal RXOUT is an output signal of adaptive hysteresis receiver 38; it is also input to reference voltage selection circuit 204. Signal RXOUTX is (a) input to reference voltage selection circuit 204 and (b) latched by a register circuit 208 under the control of a clock signal CLK, as shown. Clock signal CLK is a timing signal of receiver circuit 32, for example, that provides timing for input signal IN. In one example, clock signal CLK is aligned to a clock signal of driving circuit 26. The latched value of register circuit 208 is output as a signal DCTL, which is input to reference voltage selection circuit 204 as shown. Reference voltage selection circuit 204 utilizes signals RXOUT, RXOUTX and DCTL to select one of reference voltages D1, S1, S0, D0 for output as reference voltage signal 210 such that adaptive hysteresis receiver 38 (a) is less susceptible to noise of input signal IN and (b) does not incur timing delays such as associated with deep hysteresis receiver circuits.

Figure 3:
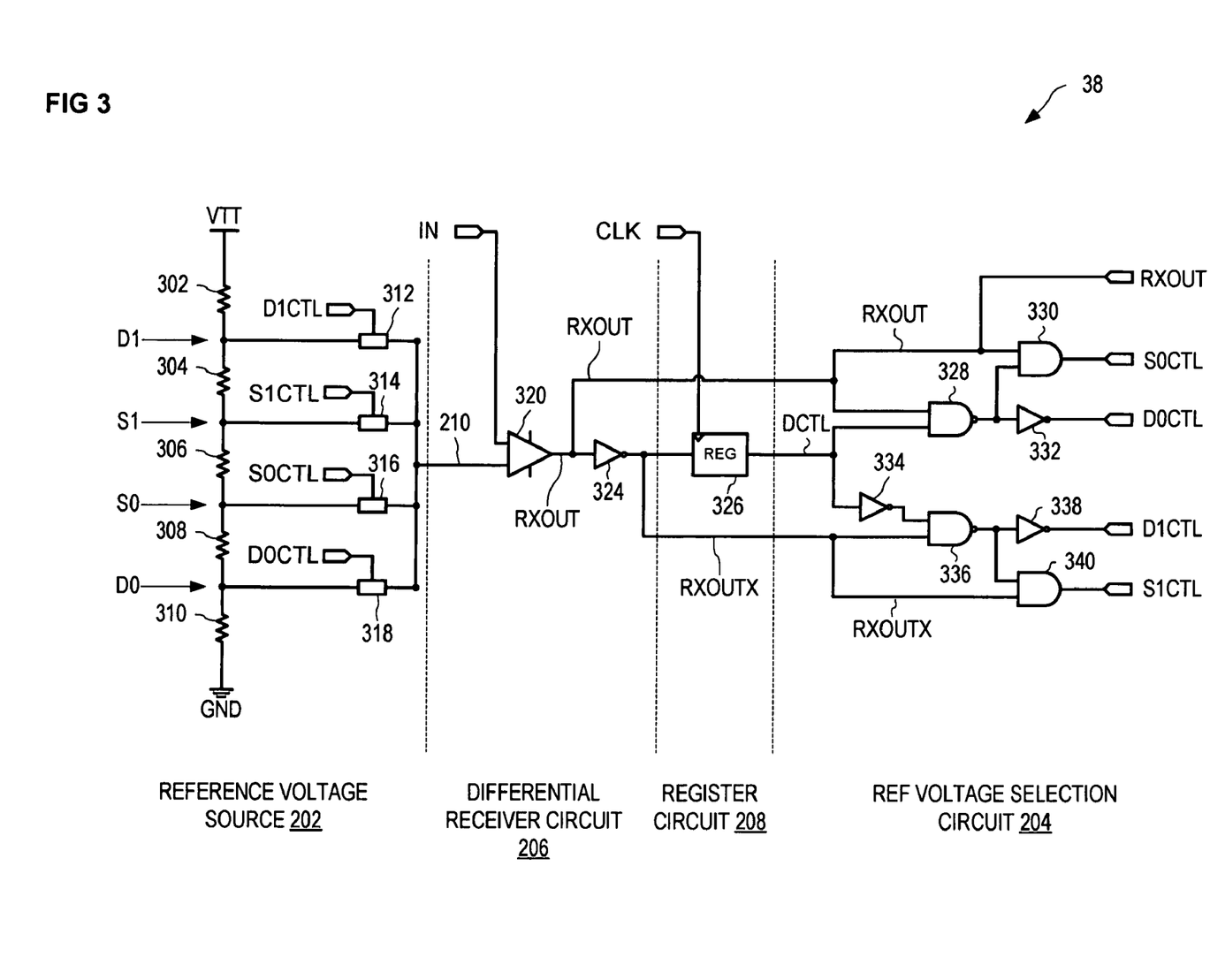
FIG. 3 is a schematic diagram illustrating exemplary circuitry suitable for use as the adaptive hysteresis receiver of FIG. 2.

FIG. 3 is a schematic diagram illustrating exemplary circuitry suitable for use as adaptive hysteresis receiver 38, FIG. 2. Voltage reference source 202 has five resistors 302, 304, 306, 308, 310 connected in series between voltage terminal terminal (VTT) and ground (GND) to produces reference voltages D1, S1, S0 and D0, as shown. In reference to FIG. 3, those skilled in the art will appreciate that reference voltages D1, S1, S0, D0 may be generated by other techniques without departing from the scope hereof. A pass-gate 312, controlled by a control signal D1CTL, operates to connect and disconnect voltage D1 to and from reference voltage signal 210. A pass-gate 314, controlled by a control signal S1CTL, operates to connect and disconnect voltage S1 to and from reference voltage signal 210. A pass-gate 316, controlled by a control signal S0CTL, operates to connect and disconnect voltage S0 to and from reference voltage signal 210. A pass-gate 318, controlled by a control signal D0CTL, operates to connect and disconnect voltage D0 to and from for voltage reference signal 210. Control signals D1CTL, S1CTL, S0CTL and D0CTL are generated by reference voltage selection circuit 204 to select reference voltages D1, S1, S0, D0, respectively, with appropriate timing as described below.

Differential receiver circuit 206 has a differential receiver 320 with a first input connected to voltage reference signal 210 and a second input connected to input signal IN. Differential receiver 320 thus compares input signal IN with the selected reference voltage of reference voltage source 202 to produce a signal RXOUT. RXOUT is high if signal IN is greater than voltage reference signal 210; otherwise it is low. Within differential receiver circuit 206, signal RXOUT is input to an inverter 324, which inverts signal RXOUT to produce signal RXOUTX. Signal RXOUT is the output of adaptive hysteresis receiver 38, and is also output from differential receiver circuit 206 to reference voltage selection circuit 204. Signal RXOUTX is also output from differential receiver circuit 206 to register circuit 208 for use internally within adaptive hysteresis receiver 38, such as described below.

Signal RXOUTX is input to a register 326 within register circuit 208; signal RXOUTX is latched by register 326 under control of clock signal CLK. Register 326 produces a signal DCTL, indicative of a "previous" output signal, that is utilized within adaptive hysteresis receiver 38 by reference voltage selection circuit 204. The "current" output signal, RXOUT, may also be latched by the rising edge of clock signal CLK in a register (not shown) external to adaptive hysteresis receiver 38.

Reference voltage selection circuit 204 has two NAND-gates 328, 336, two AND-gates 330, 340, and three inverters 332, 334 and 338, connected as illustrated in FIG. 3. Reference voltage selection circuit 204 generates control signals D1CTL, S1CTL, S0CTL and D0CTL from signals RXOUT, RXOUTX and DCTL. Control signals D1CTL, S1CTL, S0CTL, D0CTL control pass-gates 312, 314, 316, 318 to connect and disconnect reference voltages D1, S1, S0 and D0, respectively, to reference voltage signal 210, for input to differential receiver 320. Thereby, reference voltage selection circuit 204 adaptively controls hysteresis of adaptive hysteresis receiver 38 to reject noise on input signal IN. Table 1 Reference Voltage Selection, below, illustrates logical operation of reference voltage selection circuit 204. Signals RXOUTX and DCTL are input to reference voltage selection circuit 204, and signals D0CTL, S0CTL, S1CTL and D1CTL are output from reference voltage selection circuit 204.

TABLE 1

Reference Voltage Selection

| Input | | Output | | | |
|---|---|---|---|---|---|
| RXOUTX | DCTL | D0CTL | S0CTL | S1CTL | D1CTL |
| 0 | 0 | 0 | 1 | 0 | 0 |
| 0 | 1 | 1 | 0 | 0 | 0 |
| 1 | 0 | 0 | 0 | 0 | 1 |
| 1 | 1 | 0 | 0 | 1 | 0 |

Figure 4A:
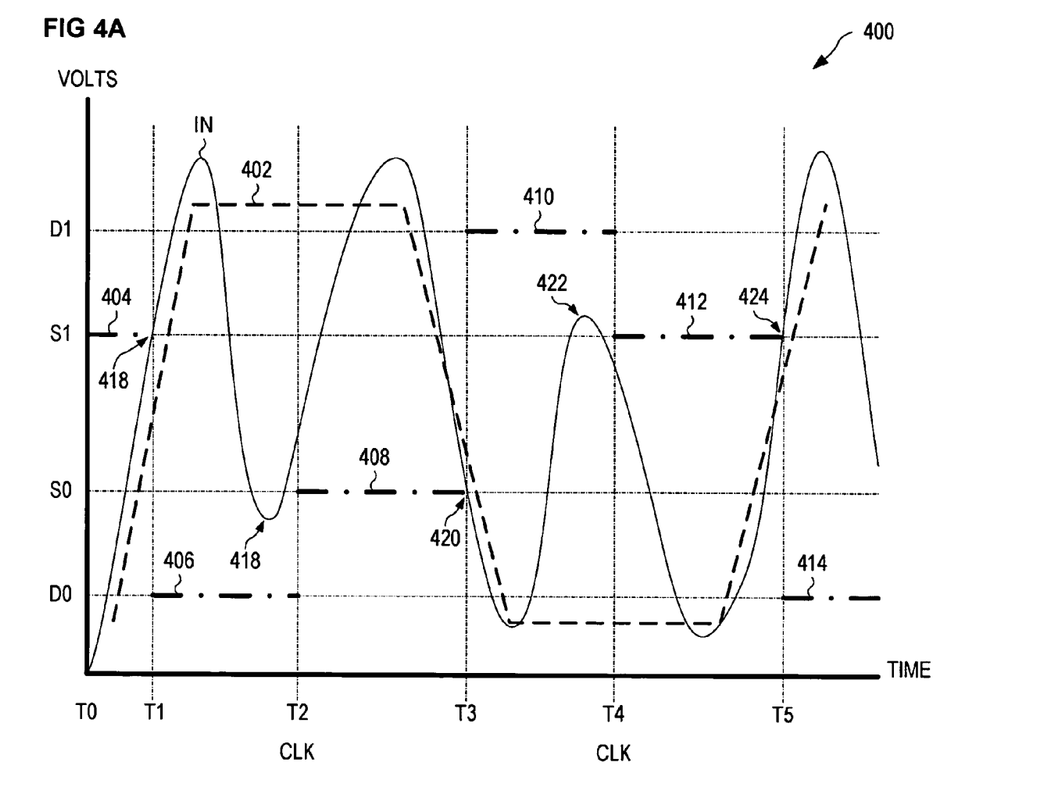
FIG. 4A is a graph of one exemplary input signal and exemplary voltage reference signals illustrating operation of the adaptive hysteresis receiver of FIG. 3.
Figure 4B:
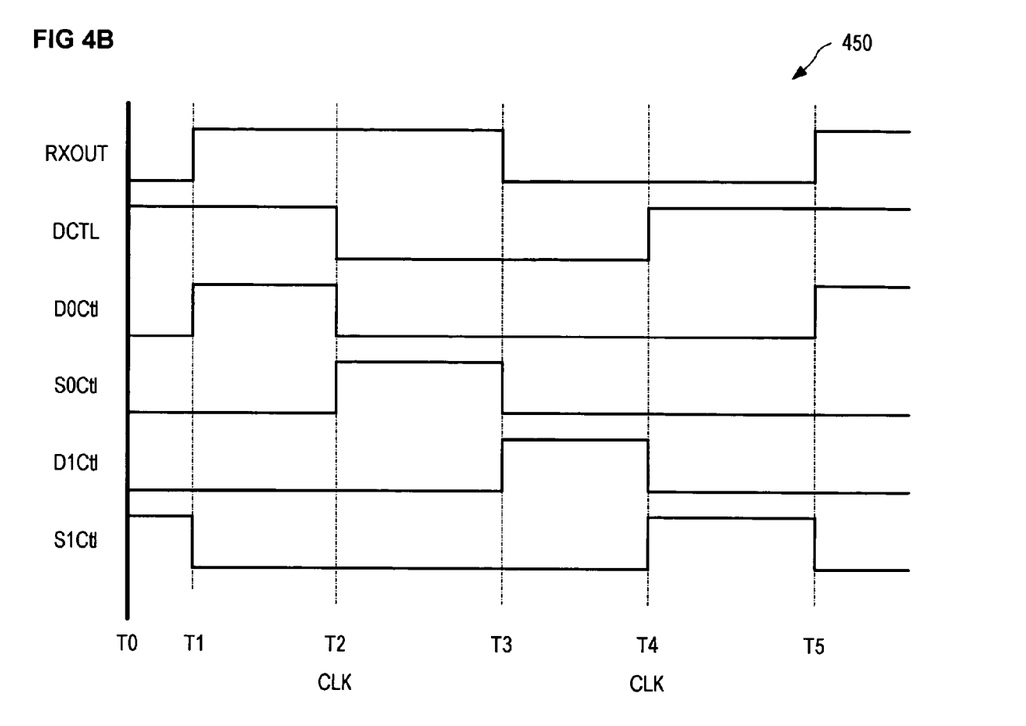
FIG. 4B is a graph illustrating exemplary operational signals of the adaptive hysteresis receiver of FIG. 3.

FIG. 4A and FIG. 4B illustrate exemplary operation of adaptive hysteresis receiver 38. FIG. 4A shows a graph 400 of one exemplary input signal IN and exemplary voltage reference signals D1, S1, S0 and D0. FIG. 4B shows a graph 450 illustrating exemplary operational signals RXOUT, DCTL, D0CTL, S0CTL, D1CTL and S1CTL. FIG. 4A and FIG. 4B are best viewed together with the following description.

In graph 400, the horizontal axis (x axis) represents time, and the vertical axis (y axis) represents voltage. Graph 400 shows input signal IN, an ideal input signal 402, reference voltages D1, S1, S0 and D0, and hysteresis levels 404, 406, 408, 410, 412 and 414 during an exemplary operation of differential hysteresis receiver 38. Ideal input signal 402 represents an input signal without noise. Input signal IN has noise, highlighted as noise 418 and noise 422, which may occur when signal input IN is received by adaptive hysteresis receiver 38(2) at a mid-position on bus 34, FIG. 1, for example. Concurrent in time with FIG. 4A, graph 450 of FIG. 4B illustrates logical state timing of signal RXOUT, signal DCTL, and control signals D0Ctl, S0Ctl, D1Ctl and S1Ctl.

More particularly, in graphs 400 and 450, at time T0, the following initial state is assumed. Signal DCTL (the latched value of register 326) is high and input signal IN is low; reference voltage S1 is selected by reference voltage selection circuit 204; and control signal S1CTL is active to select reference voltage S1, as shown by line 404.

At time T1, the voltage of input signal IN exceeds reference voltage S1 (at point 418) and output RXOUT of differential receiver 320 becomes high since input signal IN is greater than reference voltage S1. As signal RXOUT (and hence signal RXOUTX) changes, reference voltage selection circuit 204 selects reference voltage D0, as shown by line 406. For example, control signal S1CTRL is set low by reference voltage selection circuit 204, turning off pass FET 314 and disconnecting reference voltage S1 from differential receiver 320; and control signal D0CTL is set high by reference voltage selection circuit 204, turning on pass FET 318 and connecting reference voltage D0 to differential receiver 320. Thus, between times T1 and T2, adaptive hysteresis receiver 38 has strong rejection to noise 418 and is operating with a deep level of hysteresis.

At time T2, clock signal CLK latches signal RXOUTX, which is low since signal RXOUT is high, into register 326, thus changing signal DCTL, output of register 326, to low. As signal DCTL changes, reference voltage selection circuit 204 selects reference voltage S0, shown by line 408. For example, control signal D0CTRL is set low by reference voltage selection circuit 204, turning off pass FET 318 and disconnecting reference voltage D1 from differential receiver 320; and control signal S0CTL is set high by reference voltage selection circuit 204, turning on pass FET 316 and connecting reference voltage S0 to differential receiver 320. Thus, between times T2 and T3, adaptive hysteresis receiver 38 operates with a shallow level of hysteresis.

At time T3, input signal IN drops below reference voltage S0 (at point 420) and output signal RXOUT of differential receiver 320 becomes low since input signal IN is lower than reference voltage S0. As signal RXOUT (and hence signal RXOUTX) changes, reference voltage selection circuit 204 selects reference voltage D1, as shown by line 410. For example, control signal S0Ctrl is set low by reference voltage selection circuit 204, turning off pass FET 316 and disconnecting reference voltage S0 from differential receiver 320; and control signal D1Ctl is set high by reference voltage selection circuit 204, turning on pass FET 312 and connecting reference voltage D1 to differential receiver 320. Thus, between times T3 and T4, adaptive hysteresis receiver 38 has strong rejection to noise 422, and is operating with a deep level of hysteresis.

At time T4, clock signal CLK latches signal RXOUTX, which is high since signal RXOUT is low, into register 326 and signal DCTL becomes high. As signal DCTL changes, reference voltage selection circuit 204 selects reference voltage S1, as shown by line 412. For example, control signal D1Ctrl is set low by reference voltage selection circuit 204, turning off pass FET 312 and disconnecting reference voltage D1 from differential receiver 320; and control signal S1Ctl is set high by reference voltage selection circuit 204, turning on pass FET 314 and connecting reference voltage S1 to differential receiver 320. Thus, between times T4 and T5, adaptive hysteresis receiver 38 operates with a shallow level of hysteresis.

At time T5, input signal IN increases above reference voltage S1 (at point 424) and differential receiver 320 sets signal RXOUT high since input signal IN is higher than reference voltage S1. As signal RXOUT (and hence signal RXOUTX) changes, reference voltage selection circuit 204 selects reference voltage D0, as shown by line 414. For example, control signal S1Ctrl is set low by reference voltage selection circuit 204, turning off pass FET 314 and disconnecting reference voltage S1 from differential receiver 320; and control signal D0Ctl is set high by reference voltage selection circuit 204, turning on pass FET 318 and connecting reference voltage D0 to differential receiver 320. Thus, at time T5, adaptive hysteresis receiver 38 again selects a deep level of hysteresis.

Adaptive hysteresis receiver 38 may thus employ deep hysteresis level reference voltages (D0 and D1) where higher noise levels are experienced on input signal IN (i.e., after a transition in input signal IN), and shallow hysteresis level reference voltages (S0 and S1) where noise levels are smaller. True transitions are detected earlier and more reliably than by systems using only deep hysteresis levels. Adaptive hysteresis receiver 38 thereby provides high signal noise rejection without compromising signal response times.

It should also be noted that adaptive hysteresis receiver 38 may also operate with negative hysteresis, thereby improving signal response time for certain types of signal.

Figure 5:
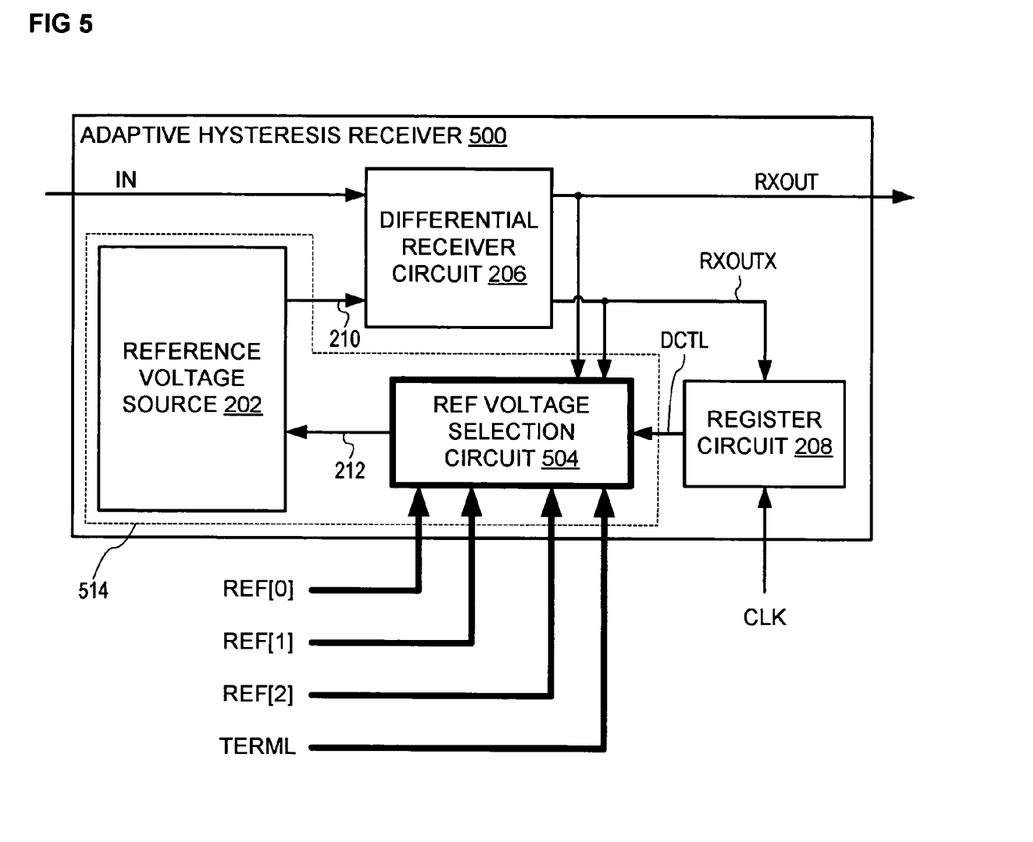
FIG. 5 illustrates one exemplary embodiment of a multimode adaptive hysteresis receiver for a high speed digital signal.

FIG. 5 illustrates one exemplary embodiment of a multi-mode adaptive hysteresis receiver 500 with configuration inputs REF[0], REF[1], REF[2] and TERML. Multi-mode adaptive hysteresis receiver 500 is, for example, suitable for use as adaptive hysteresis receiver 38, FIG. 1. In multi-mode adaptive hysteresis receiver 500, reference voltage source 202, differential receiver circuit 206 and register circuit 208 are the same as for adaptive hysteresis receiver 38, FIG. 2, respectively. Configuration inputs REF[0], REF[1], REF[2] and TERML allow selective configuration of adaptive hysteresis receiver 500 for operation at different locations on bus 34, FIG. 1 (e.g., at the locations of adaptive hysteresis receiver 38(1), adaptive hysteresis receiver 38(2), adaptive hysteresis receiver 38(3) and adaptive hysteresis receiver 38(4)). In particular, configuration inputs REF[0], REF[1], REF[2] and TERML determine operation of reference voltage selection circuit 504 in selection reference voltage 210. Reference voltage selection circuit 504 is similar to reference voltage selection circuit 204 of adaptive hysteresis receiver 38, FIG. 1, but includes additional circuitry that allows configuration inputs REF[0], REF[1], REF[2] and TERML to select an operational mode described in Table 2 Operational Modes, below. In FIG. 5, reference voltage generator 514 is illustratively shown with a reference voltage source 202 and reference voltage selection circuit 504.

Table 2 Operational Modes shows operational modes of adaptive hysteresis receiver 500 as determined by configuration inputs REF[0], REF[1] and REF[2] when configuration input TERML is set to 1. When configuration input TERML is set to 0, reference voltage signal 210 is set to reference voltage X (e.g., X is 0.75V) and configuration inputs REF[0], REF[1] and REF[2] have no effect on operation of adaptive hysteresis receiver 500.

TABLE 2

| | Operational Modes | | | |
|---|---|---|---|---|
| Mode | REF[2] | REF[1] | REF[0] | Operation |
| A | 1 | 1 | 1 | S1, S0 |
| B | 0 | 1 | 1 | D1, S1, S0, D0 |
| C | 1 | 0 | 1 | D1, D0 |
| D | 1 | 1 | 0 | X |
| E | 0 | 1 | 0 | D1, X, D0 |
| F | 0 | 0 | 1 | S1, S0, D0 |
| G | 0 | 0 | 0 | INVALID |

In mode A (i.e., TERML=1, REF[0]=1, REF[1]=1, REF[2]=1), reference voltage selection circuit 504 operates to select voltage levels S0 and S1 on reference signal 210. In mode A, adaptive hysteresis receiver 500 thus operates with one shallow level of hysteresis. Mode A is suitable for use where noise exists on input signal IN, but is not of a level that requires adaptive hysteresis levels.

In mode B (i.e., TERML=1, REF[0]=1, REF[1]=1, REF[2]=0), reference voltage selection circuit 504 operates to select voltage levels D1, S1, S0 and D0 on reference signal 210. In mode B, adaptive hysteresis receiver 500 thus operates with two (deep and shallow) levels of hysteresis; input hysteresis of adaptive hysteresis receiver 500 is thereby "adaptive" in mode B. Mode B is suitable for use where the level of input signal IN is not always greater than the deep hysteresis levels D0 and D1, although the level of noise is greater than the shallow hysteresis levels S0 and S1, for example.

In mode C (i.e., TERML=1, REF[0]=1, REF[1]=0, REF[2]=1), reference voltage selection circuit 504 operates to select voltage levels D0 and D1 on reference signal 210. In mode C, adaptive hysteresis receiver 500 thus operates with one deep level of hysteresis. Mode C is suitable for use where signal levels are consistently high but have significant noise, for example.

In mode D (i.e., TERML=1, REF[0]=0, REF[1]=1, REF[2]=1), reference voltage selection circuit 504 operates to select reference voltage X (e.g., X is 0.75V) on reference signal 210, by simultaneous connection of reference voltages S0 and S1 to reference signal 210. In mode D, adaptive hysteresis receiver 500 thus operates without hysteresis (i.e., operates the same as when configuration signal TERML is set low). Mode D is suitable for use where the level of noise is minimal, for example.

In mode E (i.e., TERML=1, REF[0]=0, REF[1]=1, REF[2]=0), reference voltage selection circuit 504 operates to select voltage levels D0, X and D1 on reference signal 210. In mode E, adaptive hysteresis receiver 500 thus operates with a deep level of hysteresis, and a fixed reference voltage X (e.g., X is 0.75V). For example, in mode E, adaptive hysteresis receiver 500 may operate as in mode B (i.e., normal two (deep and shallow) level adaptive hysteresis operation), except that reference voltage X is selected (by simultaneous connection of reference voltages S0 and S1 to reference signal 210) instead of voltages S0 and S1. Mode E is suitable for use where input signal IN has short duration noise situated close to transitions of input signal IN, for example.

In mode F (i.e., TERML=1, REF[0]=1, REF[1]=0, REF[2]=0), reference voltage selection circuit 504 operates to select voltage levels S1, S0 and D0 on reference signal 210. In mode F, adaptive hysteresis receiver 500 thus operates as in mode B except that reference voltage S1 is selected in place of reference voltage D1.

Mode G exemplifies an invalid mode of operation, indicating that the configuration input combination of TERML=0, REF[0]=0, REF[1]=0 and REF[2]=0 should not be used.

FIGS. 6B, 6C, 6D, 6E, 6F, 6G, 6H, and 6J are schematic diagrams illustrating exemplary circuitry of reference voltage selection circuit 504, FIG. 5. In particular, FIGS. 6B, 6C, 6D, 6E and 6F are schematic diagrams illustrating exemplary circuits for generating signals REF0L, TERM, D1ON, SCTLON, D0ON and DCTLOFF from configuration inputs REF[0], REF[1], REF[2] and TERML. Signals REF0L, TERM, D1ON, SCTLON, D0ON and DCTLOFF are used within schematic diagrams of FIGS. 6G, 6H and 6J.

Figure 6B:
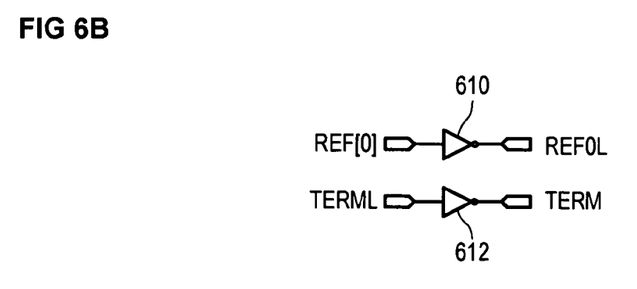
FIG. 6B shows a schematic diagram of two inverters for inverting configuration signals REF[0] and TERML to produce signals REF0L and TERM, respectively.

FIG. 6B shows a schematic diagram of two inverters that invert configuration signals REF[0] and TERML to signals REF0L and TERM, respectively. In FIG. 6B, configuration signal REF[0] is input to an inverter 610 that produces signal REF0L. Similarly, configuration signal TERML is input to an inverter 612 that produces signal TERM.

Figure 6C:
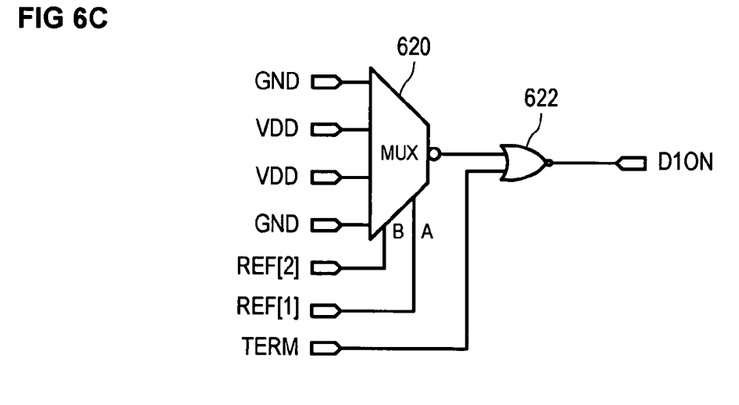
FIG. 6C shows a schematic diagram of a multiplexer (MUX) and a NOR-gate to produce a signal D1ON.

FIG. 6C shows a schematic diagram of a multiplexer (MUX) 620 and a NOR-gate 622 to produce signal D1ON from configuration signals REF[1] and REF[2], and signal TERM. Inputs of MUX 620 are connected to VDD and GND as shown such that MUX 620 and NOR-gate 622 operate to produce a logic 1 on signal D1ON when TERM is 0 (i.e., TERML is 1). Signal D1ON thus controls selection of reference voltage D1 by reference voltage selection circuit 504 (i.e., modes B, C and E of Table 2 Operational Modes).

Figure 6D:
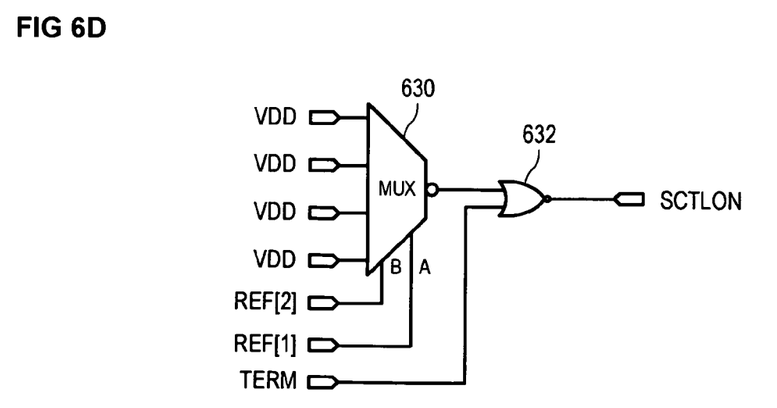
FIG. 6D shows a schematic diagram of a MUX and a NOR-gate to produce signal SCTLON.

FIG. 6D shows a schematic diagram of a MUX 630 and a NOR-gate 632 to produce signal SCTLON from configuration signals REF[1] and REF[2], and signal TERM. Inputs of MUX 630 are connected to VDD, as shown, such that MUX 630 and NOR-gate 632 operate to produce a logic 1 on signal SCTLON when TERM is 0 (i.e., TERML is 1) irrespective of inputs REF[1] and REF[2] (i.e., all modes of Table 2 Operational Modes).

Figure 6E:
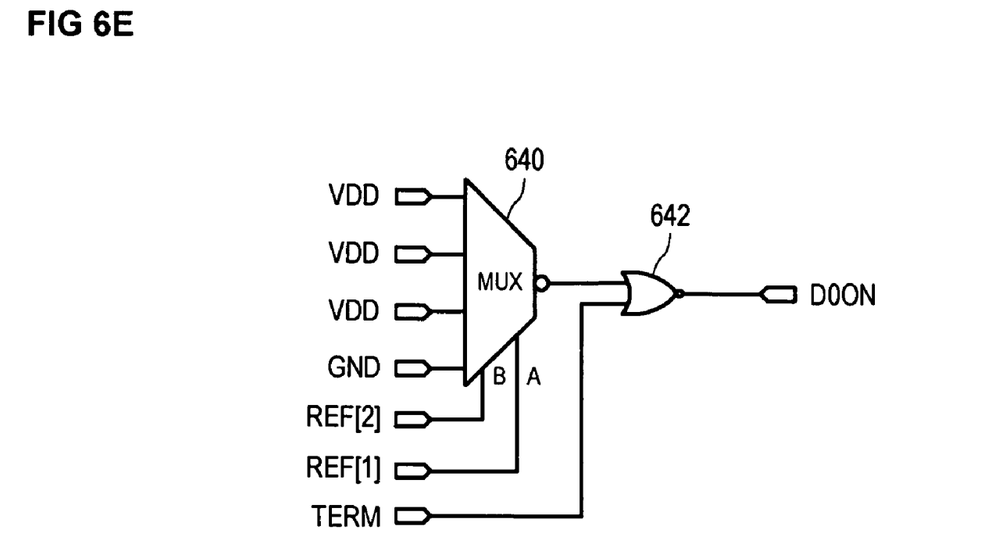
FIG. 6E shows a schematic diagram of a MUX and a NOR-gate to produce signal D0ON.

FIG. 6E shows a schematic diagram of a MUX 640 and a NOR-gate 642 to produce signal D0ON from configuration signals REF[1] and REF[2], and signal TERM. Inputs of MUX 640 are connected to VDD and GND as shown such that MUX 640 and NOR-gate 642 operate to produce a logic 1 on signal D0ON when TERM is 0 (i.e., TERML is 1). Signal D0ON thus controls selection of reference voltage D0 by reference voltage selection circuit 504 (i.e., modes B, C, E and F of Table 2 Operational Modes).

Figure 6F:
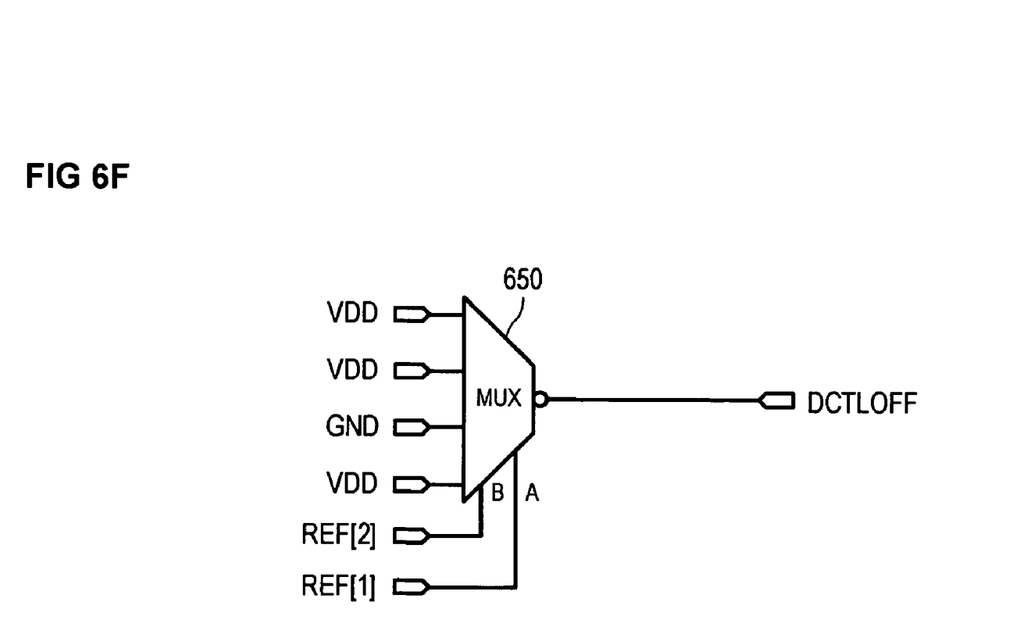
FIG. 6F shows a schematic diagram of a MUX to produce signal DCTLOFF.

FIG. 6F shows a schematic diagram of a MUX 650 to produce signal DCTLOFF from configuration signals REF[1] and REF[2]. Inputs of MUX 650 are connected to VDD and GND as shown such that MUX 650 operates to produce a logic 1 on signal DCTLOFF only when REF[1] is zero and REF[2] is one (i.e., mode C of Table 2 Operational Modes).

Figure 6G:
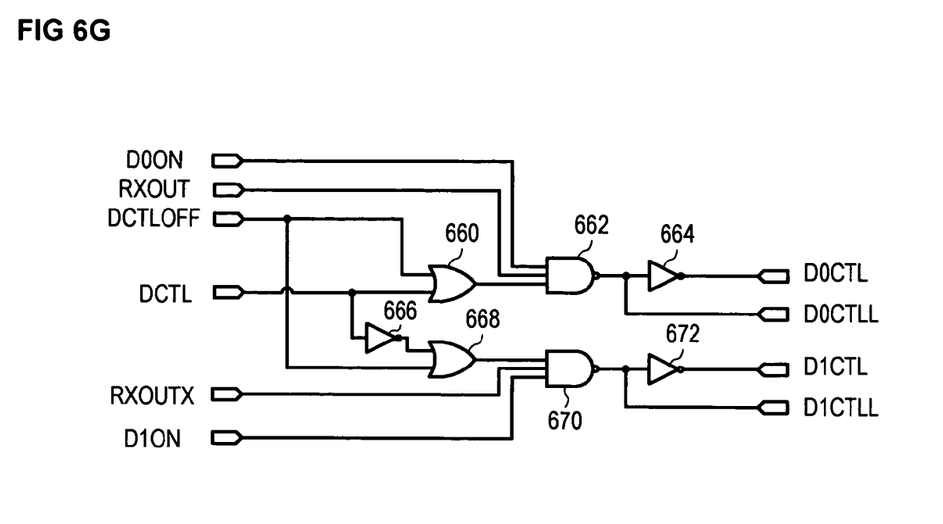
FIG. 6G shows a schematic diagram of two OR-gates, two NAND-gates, and three inverters to produce control signals D0CTL, D1CTL and their respective inverted signals, D0CTLL and D1CTLL.

FIG. 6G shows a schematic diagram of two OR-gates 660, 668, two NAND-gates 662, 670, and three inverters 664, 666 and 672, to produce control signals D0CTL, D1CTL and their respective inverted signals, D0CTLL and D1CTLL. Signal DCTLOFF disables toggling of signals D0CTL and D1CTL (and their inverted signals D0CTLL and D1CTLL, respectively) by signal DCTL when enabled by signals D0ON, RXOUT and D1ON and RXOUTX, respectively. For example, D0CTL is high if (a) D0ON is high, (b) RXOUT is high, and (c) either or both DCTLOFF and DCTL are high. D1CTL is high if (a) D1ON is high, (b) RXOUTX is high, and (c) either DCTLOFF is high or DCTLOFF is low and DCTL is low. Control signals D0CTL and D1CTL turn on pass-gates 318 and 312, respectively, when high.

Figure 6H:
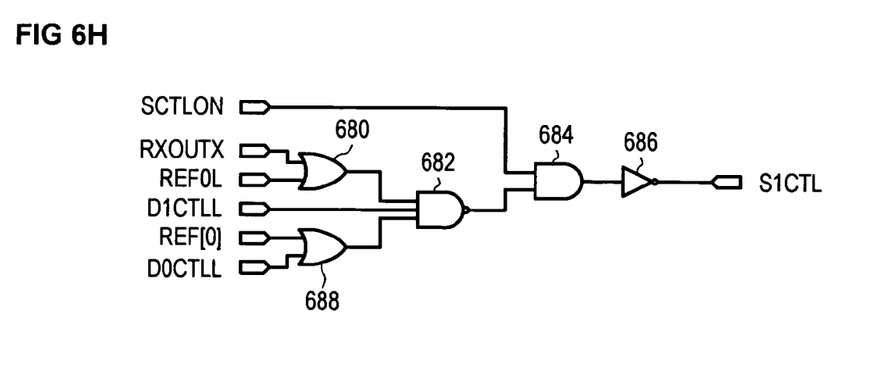
FIG. 6H shows a schematic diagram of two OR-gates, one NAND-gate, one AND-gate and one inverter to produce control signal S1CTL.

FIG. 6H shows a schematic diagram of two OR-gates 680, 688, one NAND-gate 682, one AND-gate 684 and one inverter 686, cooperating to produce control signal S1CTL. Signal SCTLON connects to AND-gate 684 to provide overall control of signal S1CTL. If SCTLON is low, S1CTL is always set high. If SCTLON is high, S1CTL is controlled by signals RXOUTX, REF[0] (and hence REF0L), D1CTLL, and D0CTLL. If REF[0] is low and SCTLON is high, S1CTL is controlled by RXOUTX and D1CTLL. If REF[0] is high and SCTLON is high, S1CTL is controlled by D0CTLL and D1CTLL.

Figure 6J:
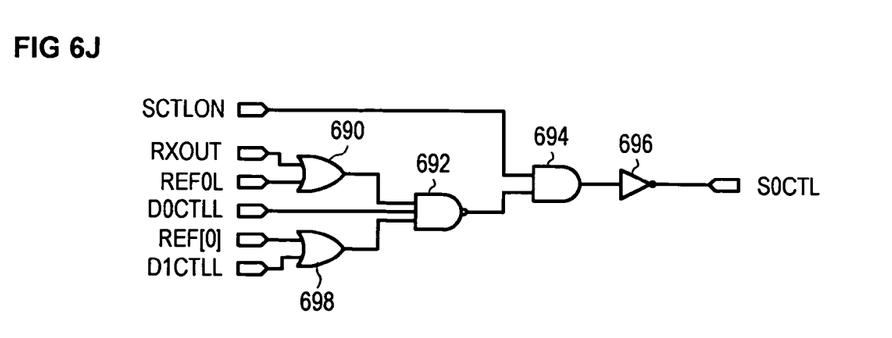
FIG. 6J shows a schematic diagram of two OR-gates, one NAND-gate, one AND-gate and one inverter to produce control signal S0CTL.

FIG. 6J shows a schematic diagram of two OR-gates 690, 698, one NAND-gate 692, one AND-gate 694 and one inverter 696, cooperating to produce control signal S0CTL. Signal SCTLON connects to AND-gate 694 to provide overall control of signal S0CTL. If SCTLON is low, S0CTL is always set high. If SCTLON is high, S0CTL is controlled by signals RXOUT, REF[0] (and hence REF0L), D1CTLL, and D0CTLL. If REF[0] is low and SCTLON is high, S0CTL is controlled by RXOUT and D0CTLL. If REF[0] is high and SCTLON is high, S0CTL is controlled by D0CTLL and D1CTLL.

As appreciated, circuitry of FIGS. 6B, 6C, 6D, 6E, 6F, 6G, 6H and 6J interconnect to form reference voltage selection circuit 504 of adaptive hysteresis receiver 500. Configuration inputs REF[0], REF[1], REF[2] and TERML may be used to select an operating mode (e.g., a mode of Table 2 Operational Modes) for adaptive hysteresis receiver 500 such that adaptive hysteresis receiver 500 may be used at any position on bus 34, FIG. 1, for varying amounts of input signal noise, and for varying timing requirements.

Operational mode A, B, C, D, E, F of adaptive hysteresis receiver 500 may be selected to suit the location of adaptive hysteresis receiver 500 on bus 34 and to suit the levels of noise on input signal IN, such that signal RXOUT is produced without noise and without unnecessary delay.

Figure 7:
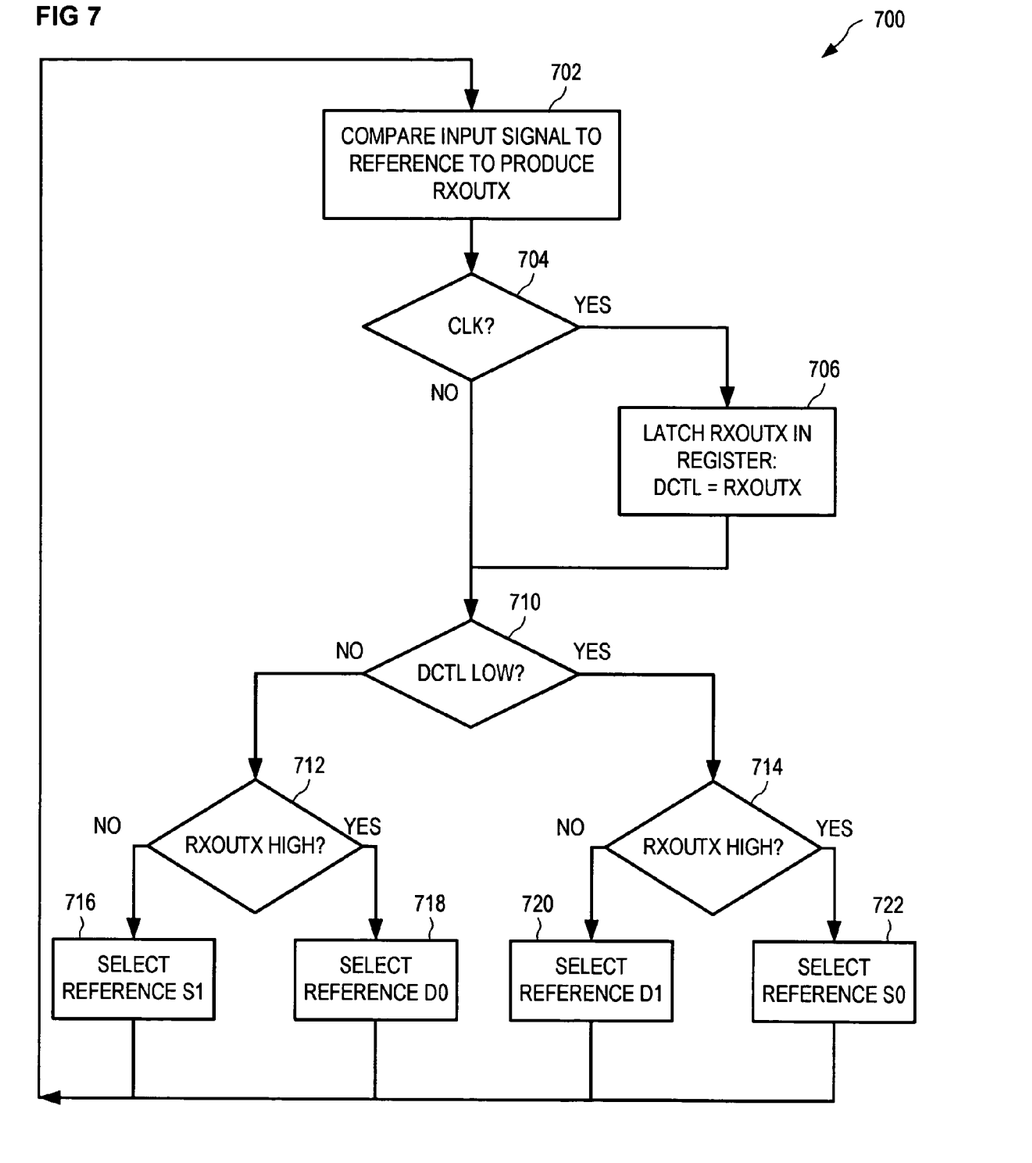
FIG. 7 is a flowchart illustrating one exemplary process that may be implemented by reference voltage selection circuit of FIG. 2.

FIG. 7 is a flowchart showing one exemplary process 700 that illustrates operation of adaptive hysteresis receiver 38, FIG. 2. Process 700 is a continuous loop that compares input signal IN to a selected reference voltage to produce an output signal RXOUT. A clock signal periodically latches signal RXOUTX (inverted signal RXOUT) to produce signal DCTL. A reference voltage D0, S0, S1, D1 is then selected, based upon signals DCTL and RXOUT.

In step 702, differential receiver circuit 206 compares input signal IN to a selected reference voltage to produce signal RXOUT and its inverse, RXOUTX.

Step 704 is a decision. If clock signal CLK occurs, process 700 continues with step 706; otherwise process 700 continues with step 710. In step 706, process 700 makes signal DCTL equal to signal RXOUTX, produced in step 702, by latching signal RXOUTX in register circuit 208.

Step 710 is a decision. If signal DCTL is low, process 700 continues with step 714; otherwise process 700 continues with step 712.

Step 712 is a decision. If signal RXOUTX is high, process 700 continues with step 718; otherwise process 700 continues with step 716.

Step 714 is a decision. If signal RXOUTX is high, process 700 continues with step 722; otherwise process 700 continues with step 720.

In step 716, process 700 selects reference voltage S1. In one example of step 716, process 700 activates signal S1CTL and deactivates signals D0CTL, S0CTL and D1CTL, thereby connecting reference voltage S1 to differential receiver circuit 206. Process 700 then continues with step 702.

In step 718, process 700 selects reference voltage D0. In one example of step 718, process 700 activates signal D0CTL and deactivates signals S1CTL, S0CTL and D1CTL, thereby connecting reference voltage D0 to differential receiver circuit 206. Process 700 then continues with step 702.

In step 720, process 700 selects reference voltage D1. In one example of step 720, process 700 activates signal D1CTL and deactivates signals D0CTL, S0CTL and S1CTL, thereby connecting reference voltage D1 to differential receiver circuit 206. Process 700 then continues with step 702.

In step 722, process 700 selects reference voltage S0. In one example of step 722, process 700 activates signal S1CTL and deactivates signals D0CTL, S1CTL and D1CTL, thereby connecting reference voltage S0 to differential receiver circuit 206. Process 700 then continues with step 702.

In process 700, steps 702 and 706 occur serially for clarity of illustration. However, steps 702 and 706 may occur simultaneously and/or simultaneously with other steps of process 700. Steps 710, 712, 714, 716, 718, 720 and 722 also occur concurrently within reference voltage selection circuit 204.

As appreciated, process 700 illustrates exemplary operation of adaptive hysteresis receiver 38 (and adaptive hysteresis receiver 500 operating in mode B). In the illustrated operation, adaptive hysteresis receiver 38 operates autonomously and concurrently processes input signal IN and clock signal CLK.

Figure 8:
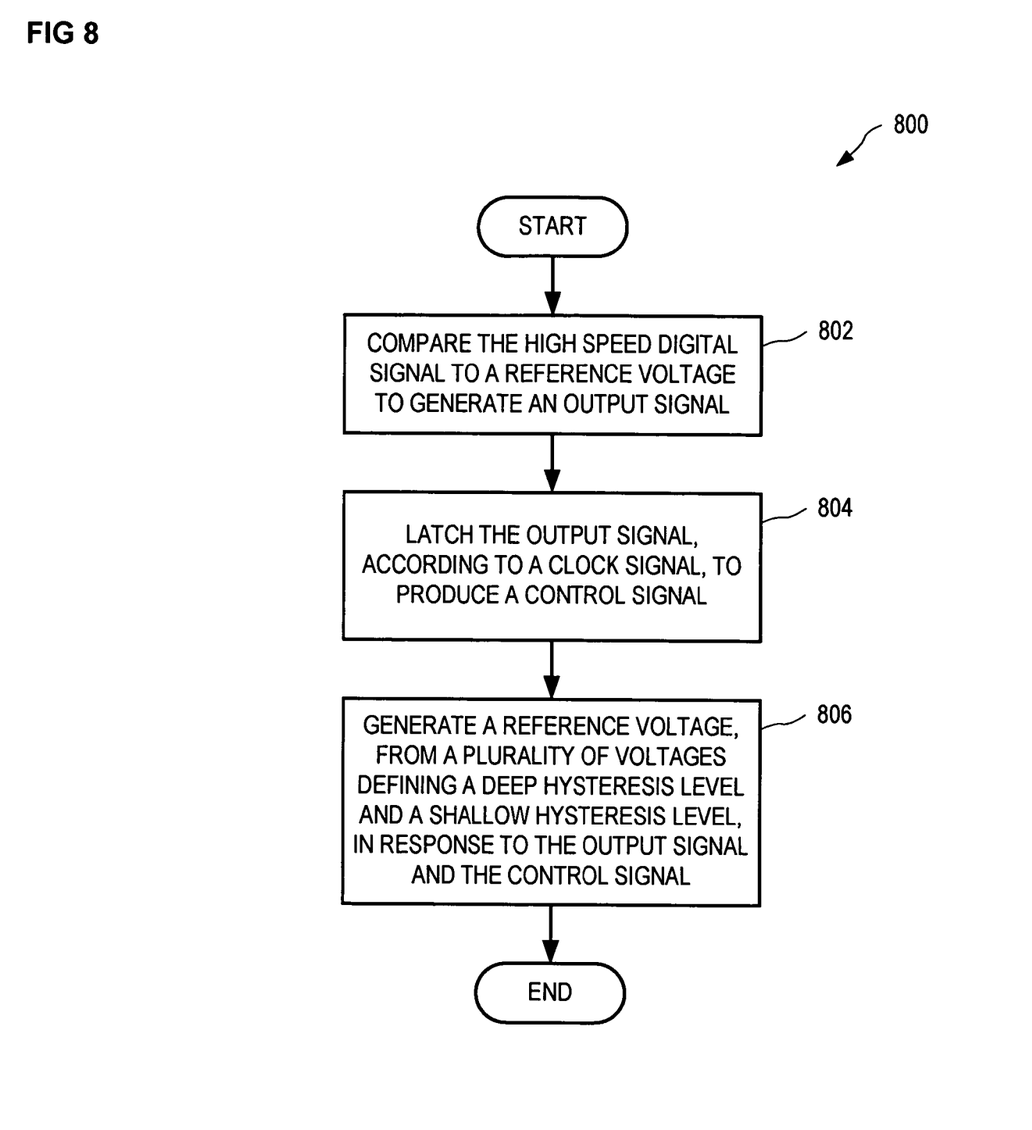
FIG. 8 is a flowchart illustrating an embodiment of processing a high speed digital signal with an adaptive hysteresis receiver.

FIG. 8 is a flowchart illustrating an embodiment of one process 800 that reduces noise from a high speed digital signal with adaptive hysteresis. Process 800 is for example implemented by differential receiver 206, register circuit 208 and reference voltage generator 214 of FIG. 1. In step 802, process 800 compares the high speed digital signal to a reference voltage, to generate an output signal. In step 804, process 800 latches the output signal, according to a clock signal, to produce a control signal. In step 804, process 800 generates a reference voltage, from a plurality of voltages defining a deep hysteresis level and a shallow hysteresis level, in response to the output signal and the control signal.

It is thus appreciated that signal RXOUT, FIG. 2, may be produced by adaptive hysteresis receiver 38 (and adaptive hysteresis receiver 500, FIG. 5) with advantages in both timing and noise protection. In one example, adaptive hysteresis receiver 38 may remove noise from high speed digital signal IN, using deep hysteresis voltages D0 and D1, and yet quickly respond to valid signal transitions, using shallow hysteresis voltages S0 and S1, to produce signal RXOUT. In another example, adaptive hysteresis receiver 38 maintains data validity alignment of signal RXOUT and clock signal CLK, and thus operates with less delay between input signal IN and signal RXOUT as incurred by other deep hysteresis receivers. Adaptive hysteresis receiver 500 may be configurable, by use of configuration inputs REF[0], REF[1], REF[2] and TERML, to operate in one of many operating modes: without hysteresis, with two level hysteresis, with adaptive hysteresis, and with three level hysteresis.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An adaptive hysteresis receiver for a high speed digital signal, comprising:
    a differential receiver circuit for comparing the high speed digital signal to a reference voltage to generate an output signal;
    a register circuit for latching the output signal, according to a clock signal, to produce a control signal; and
    a reference voltage generator for generating the reference voltage, from a plurality of voltages defining a deep hysteresis level and a shallow hysteresis level, in response to the output signal and the control signal, and an inverse of the output signal.

2. The adaptive hysteresis receiver of claim 1, the differential receiver generating the inverse of the output signal.

3. The adaptive hysteresis receiver of claim 1, the reference voltage generator being operable to generate the reference voltage for the deep hysteresis level upon a transition of the high speed digital signal that passes a reference voltage of the shallow hysteresis level.

4. The adaptive hysteresis receiver of claim 3, wherein at least one of a pair of the plurality of voltages defines the deep hysteresis level.

5. The adaptive hysteresis receiver of claim 4, wherein one of the pair corresponds to the shallow hysteresis level.

6. The adaptive hysteresis receiver of claim 3, wherein one of the plurality of voltages defines the shallow hysteresis level.

7. The adaptive hysteresis receiver of claim 1, the reference voltage generator being responsive to the clock signal to generate the reference voltage of the shallow hysteresis level.

8. The adaptive hysteresis receiver of claim 1, wherein the reference voltage generator comprises a reference voltage source and a reference voltage selection circuit, the reference voltage source responsive to a voltage selection signal from the reference voltage selection circuit to generate the reference voltage from the plurality of voltages, the reference voltage selection circuit responsive to the output signal, the control signal, and an inverse of the output signal to generate the voltage selection signal.

9. The adaptive hysteresis receiver of claim 1, the plurality of voltages comprising (a) two voltages defining the deep hysteresis level and (b) two voltages defining the shallow hysteresis level.

10. The adaptive hysteresis receiver of claim 1, the reference voltage generator being responsive to one or more configuration inputs to select the plurality of voltages.

11. The adaptive hysteresis receiver of claim 1, the plurality of reference voltages being generated by a resistor network.

12. The adaptive hysteresis receiver of claim 1, wherein the clock signal aligns to data validity of the high speed digital signal.

13. An adaptive hysteresis receiver for a high speed digital signal, comprising:
    a differential receiver circuit for comparing the high speed digital signal to a reference voltage to generate an output signal;
    a register circuit for latching the output signal, according to a clock signal, to produce a control signal; and
    a reference voltage generator for generating a reference voltage, from a plurality of voltages defining (a) no hysteresis, (b) one or more hysteresis levels, and (c) adaptive hysteresis, in response to one or more configuration inputs.

14. A method for reducing noise received with a high speed digital signal, comprising:
    comparing the high speed digital signal to a reference voltage to generate an output signal;
    latching the output signal, according to a clock signal, to produce a control signal; and
    generating the reference voltage, from a plurality of voltages defining a deep hysteresis level and a shallow hysteresis level, in response to the output signal and the control signal and an inverse of the output signal.

15. The method of claim 14, the step of generating comprising generating the reference voltage for the deep hysteresis level when the high speed digital signal passes a reference voltage of the shallow hysteresis level.

16. The method of claim 14, the step of generating comprising generating the reference voltage of the shallow hysteresis level in response to the clock signal.

17. A method for reducing noise received with a high speed digital signal, comprising:
   selecting a shallow hysteresis level based upon a previous output signal and a clock signal;
   comparing the high speed digital signal to the shallow hysteresis level to produce a current output signal;
   selecting a deep hysteresis level if a transition occurs in the current output signal; and
   latching the current output signal by the clock signal to produce the previous output signal and the step of selecting the shallow hysteresis level comprising selecting a first voltage, based upon the clock signal, if the previous output signal is low.

18. The method of claim 17, the step of selecting the shallow hysteresis level comprising selecting a first voltage, based upon the clock signal, if the previous output signal is high.

19. The method of claim 17, the step of selecting the deep hysteresis level comprising selecting a third voltage if the output signal transitions to high.

20. The method of claim 17, the step of selecting the deep hysteresis level comprising selecting a fourth voltage if the output signal transitions to low.

* * * * *